(12) United States Patent
Yin et al.

(10) Patent No.: US 12,208,416 B2
(45) Date of Patent: Jan. 28, 2025

(54) CMUT-on-CMOS ULTRASONIC TRANSDUCER BY BONDING ACTIVE WAFERS AND MANUFACTURING METHOD THEREOF

(71) Applicant: Zhejiang Xiansheng Technology Co., Ltd., Taizhou (CN)

(72) Inventors: Feng Yin, Taizhou (CN); Hui Li, Taizhou (CN)

(73) Assignee: Zhejiang Xiansheng Technology Co., Ltd., Taizhou (CN)

( * ) Notice: Subject to any disclaimer, the term of this patent is extended or adjusted under 35 U.S.C. 154(b) by 166 days.

(21) Appl. No.: 17/993,899

(22) Filed: Nov. 24, 2022

(65) Prior Publication Data
US 2023/0302495 A1 Sep. 28, 2023

(30) Foreign Application Priority Data
Mar. 28, 2022 (CN) .......................... 202210308406.0

(51) Int. Cl.
*B81B 7/00* (2006.01)
*B06B 1/02* (2006.01)
*B81C 1/00* (2006.01)

(52) U.S. Cl.
CPC .......... *B06B 1/0292* (2013.01); *B81B 7/0006* (2013.01); *B81C 1/00238* (2013.01); *B81B 2201/0271* (2013.01); *B81B 2203/0127* (2013.01); *B81B 2203/04* (2013.01); *B81B 2207/012* (2013.01); *B81B 2207/03* (2013.01); *B81B 2207/07* (2013.01);
(Continued)

(58) Field of Classification Search
CPC ... B06B 1/0292; B06B 1/0207; B81B 7/0006; B81B 2201/0271; B81B 2203/0127; B81B 2203/04; B81B 2207/012; B81B 2207/03; B81B 2207/07; B81B 7/007; B81B 7/008; B81B 7/02
See application file for complete search history.

(56) References Cited

U.S. PATENT DOCUMENTS

2016/0262725 A1\* 9/2016 Boser .................. A61B 8/4483
2021/0061647 A1\* 3/2021 Chen .................. B81C 1/00246
(Continued)

FOREIGN PATENT DOCUMENTS

CN 113666327 A 11/2021

*Primary Examiner* — Moazzam Hossain
(74) *Attorney, Agent, or Firm* — Chun-Ming Shih; HDLS IPR SERVICES

(57) ABSTRACT

The present invention provides a new architecture of system-on-chip ultrasonic transducer array. It is based on fusion bond of two active wafers which have prefabricated CMOS integrated circuits and CMUT structures; precise thin-down of one wafer to form CMUT monocrystalline silicon membrane; and then to vertically connect CMUT array to CMOS IC layers underneath. This architecture can realize a high-density CMUT array with multiple layers of CMOS devices, such as all supporting CMOS ICs, to achieve a SOC solution. The present invention further provides a manufacturing method for above-mentioned SOC CMUT approach, and this manufacturing process can be realized in both 8 inch and 12-inch wafer manufacturing fabs. The disclosed manufacturing processes are more compatible with existing CMOS process flow, more cost-competitive for mass production.

10 Claims, 7 Drawing Sheets

(52) U.S. Cl.
CPC .......................... *B81C 2201/0104* (2013.01); *B81C 2203/036* (2013.01); *B81C 2203/0792* (2013.01)

(56) References Cited

U.S. PATENT DOCUMENTS

| | | | |
|---|---|---|---|
| 2023/0060728 A1* | 3/2023 | Li | ....................... H01L 25/0657 |
| 2023/0302494 A1* | 9/2023 | Lin | ....................... B06B 1/0622 |

* cited by examiner

CMUT-on-CMOS ULTRASONIC TRANSDUCER BY BONDING ACTIVE WAFERS AND MANUFACTURING METHOD THEREOF

CROSS REFERENCE TO RELATED PATENT APPLICATION

This patent application is based on a China patent application No. 2022103084060 filed on Mar. 28, 2022.

FIELD OF THE INVENTION

The present invention relates to capacitive micromachined ultrasonic transducer on complementary metal oxide semiconductor (CMUT-on-CMOS) with fusion bond of two active wafers with prefabricated CMOS devices, CMUT membrane structures and wafer to wafer vertical interconnection manufacturing method.

BACKGROUND OF THE INVENTION

Ultrasonic diagnostic instrument transmits ultrasonic waves to human body via its ultrasonic probe, and receive various information generated by reflection, refraction, and diffraction of sound waves during propagation of human organs and tissues for further amplifying, processing and forming an image as a result which is eventually shown on instrument display panel. Comparing with other medical imaging technologies, ultrasonic imaging technology is non-intrusive and painless. It also has advantages such as immediacy, safe and at low cost. It is widely used in departments of gynecology, obstetrics, urology, thoracic, pediatrics, cardiology, and in emergency case. This technology is gradually adopted in clinical examinations and applications in departments of gastroenterology (ultrasonic endoscopy) and cardiac surgery (vascular ultrasonic scan). At present days, the ultrasonic scan is an indispensable examination method.

Ultrasonic technologies and products enter daily life quickly, too. Fingerprint ultrasonic identification implemented in smart phones is not only fast and convenient but also improves personal information security significantly. Prolifically, ultrasonic transducers already are adopted in the fields of unmanned vehicles and robotics. Ultrasonic transducers are also widely used in industrial control field. For example, it is used to detect if there is ice layer on airplane wings, and they are installed in aircraft jet engines for detecting mechanical crack related noise in real time, for the same safety reason.

Traditional ultrasonic probe is made of piezoelectric ceramic crystals which are mechanically diced, re-arranged to array form, and wired to metal interconnections. At first, a piece of piezoelectric ceramic crystals is mounted on a support substrate. Then it is mechanically die sawed along with X and Y directions. Good pieces are selected and re-arranged to required format, to form metal contact on both top and bottom, and connect to separate wires. This is a manual process, very time consuming, prone to mishandling and hard to control manufacturing yield and cost. More importantly, this machining manipulation process dice-saw precision limitation, and the minimum size of crystal is not small enough to meet the requirement of high-resolution, multiple frequency medical imaging which demands shrinking size of ultrasonic transducer.

MEMS (micro-electro-mechanical system) technology based on CMOS (complementary metal oxide semiconductor) manufacture process becomes more and more important. It is viewed as a developing direction of ultrasonic transducer. MEMS ultrasonic transducers are benefited from high precision and high yield of CMOS manufacture process. This technology has the best chance to realize high resolution medical imaging by ultrasonic transducer array. MEMS ultrasonic transducers consist of two major categories: PMUT (piezoelectric micromachined ultrasonic transducer) and CMUT (capacitive micromachined ultrasonic transducer). PMUT needs special piezoelectric materials and the most commonly used piezoelectric materials include AlN and PZT (Pb(ZrTi)O3). Comparing with standard CMOS manufacture process, differences of the materials and the manufacture process in making PMUT are quite significant. For example, special equipment is required for deposition, etch and cleaning of PZT material, which are not found in existing CMOS fabs. CMUT can be made of materials compatible with CMOS manufacture process, for this reason, CMUT manufacture capability comes earlier than PMUT and is more commonly found among foundries.

When density of ultrasonic transducer array increases, metal interconnections complexity increase, the number of metal lines and lengths of metal lines increase rapidly. At the same time, the number of metal bonding pads also increase, which results in more and longer metal interconnection between array and these bond pads. In parallel, bonding wires between the bond pads and pins of IC package also increase dramatically. As the result, chip area consumed by these metal interconnection and bonding pads is far larger than the area occupied by the transducer array itself. In another word, in planar CMUT process, as the array density increase, die area taken by interconnection and bonding pads could be far greater than Silicon area for active array. Meanwhile, all metal interconnection and bond pads/wires have parasitic resistance and capacitance, as well as inductance in long bond wire cases, the associated IR drop (voltages loss), RC delay, electromagnetic interferences and crosstalk between metal lines or to substrate become significant. All these side effects will degrade performance of transducer array, increase power consumption, and increase chip size and thus die cost significantly. And the degradation is getting worse when the density of array is growing.

CMUT needs auxiliary circuits to support proper functions. FIG. 1 is a circuit block diagram of a typical CMUT system. It is understandable that CMUT needs a high voltage (typically 40-80 volt) pulse module which include high voltage charge pump circuits, pulse modulation and control circuits. As shown in the figure, the transducer pulse modulation module 10, high voltage source circuits 101 generate and output high voltage signals. High voltage pulse control circuits 102 are utilized to generate pulse driving signals with a specific ultrasound frequency for driving CMPU to vibrate, so as ultrasounds are transmitted. This is the transmission operation of ultrasound. When the ultrasound reaches object, such as human organs, and reflects, ultrasound Tx/Rx module switches to low-voltage receiver mode. CMUT receives ultrasound echo, turning into capacitance changes and export to a low noise amplifier 104 to convert to a voltage output signal, and then further amplified through variable gain control circuits 105. An ADC circuits 106 converts the analog signals from amplifiers into digital signal and output to a microprocessor. The microprocessor executes an ultrasound image processing algorithm for image display.

No matter in transmission mode or in receiving mode, CMUT needs to work with analog and digital circuits made in CMOS, as shown in the CMUT system block diagram. Today, this system is implemented at PCB (printed circuit board) level, meaning each circuit in the block diagram has its own package unit, and all these packaged ICs are connected through solder bonds and copper lines on PCB. Today, this PCB is very bulky, and all parasitic (resistance, capacitance, inductance) from PCB and connection cables will impact the overall performance of the system. For large ultrasonic systems such as floor-standing ultrasonic scanner, this form factor maybe not a problem yet. However, the demands of miniaturized ultrasonic scanners for mobility, such as portable or even handheld ultrasound systems, are growing fast, there is a strong demand that the form factor of ultrasonic scanners need to be reduced.

MEMS-on-CMOS means MEMS components are placed on top of CMOS chip, in order to achieve high level system-on-chip integration. CMUT-on-CMOS takes the same approach, to put CMUT array on top of CMOS, and vertically connect the two chips into one system-on-chip which has silicon footprint of one chip, and to reduced number of packaged IC units and thus to achieve more compact system.

However, when building CMUT on top of CMOS, selection of materials and manufacture process are constrained. CMUT normally utilize metal, such as aluminum/copper, as mechanically vibrating capacitor electrodes, other materials utilized could be SiO2, Si3N4, polysilicon, or a combination of abovementioned material. However, metal alloy, amorphous or porous SiO2/Si3N4, can easily suffer from mechanical fatigue problem. Structure nonuniformities within these materials caused by mixed lattice orientation, different grain size, uneven alloy boundaries etc., leads to problems of nonuniform residual stress, uneven surface valance bond, which may impact initial states of electrodes of CMUT, and cause performance variation across array. Besides, mechanical fatigue can easily induce CMUT parameters value shift over time, or even impact reliability of a product. Monocrystalline silicon, Si, is well known for its mechanical durability, manufacturing uniformity and reproducibility. Si is an excellent candidate as part of the vibrating electrode structure. However, it is impossible to form a Si mechanical layer on top of CMOS wafer with prefabricated metal lines, as temperature of growing silicon epitaxial layer is higher than 1000 Celsius degrees.

For abovementioned reasons, SOI (Silicon-On-insulator) is selected to make vibrating electrode of CMUT array in some cases. SOI can provide very thin layer of monocrystalline silicon (usually in a few tenth or several micrometers). There is a SiO2 layer between the thin monocrystalline silicon and bulk silicon substrate. Hence one can easily etch away the bulk Si substrate and etch-stop on this SiO2 layer, and only leave the thin Si behind as mechanical layer. However, the drawback of this method is that SOI is very expensive, and CMUT manufacture cost is raised significantly. Meanwhile, designing and manufacturing CMOS IC on SOI substrate are not the same as doing that on standard CMOS substrate. It further complicates IC and system design as well as manufacture process.

SUMMARY OF THE INVENTION

To solve the aforementioned technical problems, the present invention provides a CMUT-on-CMOS ultrasonic transducer architecture, based on three major steps: first the fusion bond of two wafers, each has prefabricated CMUT structures and CMOS device layers; and then the top second wafer is thinned down to release CMUT cells; and finally, to vertically connect the 2 CMOS layers and CMUT array layer, in much smaller design pitch. A stacked three-layer device, i.e., a high-density CMUT-on-CMOS is realized, but it only occupies one layer of silicon die.

The present invention further provides a manufacturing method for integrating an ultrasonic system on a chip. The adopted active wafer bonding, thinning technologies and vertical interconnection between wafers can be realized in both 8 inch and 12-inch wafer manufacture fabs. The manufacture processes published by the present invention can realize CMUT-on-CMOS with monocrystalline silicon vibration mechanical layer. The proposed manufacture processes are more economic and easier for mass production.

A manufacturing method for integrating an ultrasonic system on a chip is provided according to the present invention. The method comprising: forming the first wafer, wherein the first wafer includes prefabricated CMOS (complementary metal oxide semiconductor) circuits and a CMUT (capacitive micromachined ultrasonic transducer) first electrode; forming the second wafer, wherein the second wafer includes prefabricated CMOS circuits, a cavity and a CMUT second electrode; fusion bonding the first wafer and the second wafer face to face; thinning down the second wafer to form a monocrystalline silicon mechanical layer; and making TOVs (Through Oxide Vias) which vertically interconnect the first and the second wafers and metal interconnects.

Preferably, said thinning further comprises mechanical grinding thinning.

Preferably, said thinning further comprises chemical etching thinning, with doping concentration dependent etch rate control and etch-stop.

Preferably, said thinning further comprises final CMP chemical mechanical polishing.

Preferably, the first wafer or the second wafer does not start with SOI (Silicon on Insulate) material or include SOI material.

A SOC (system-on-chip) ultrasonic transducer is further provided by the present invention. The SOC ultrasonic transducer comprising: a first chip, wherein the first chip comprises a silicon substrate and substrate material, wherein the silicon substrate includes prefabricated CMOS circuits and wherein the substrate material includes prefabricated a CMUT first electrode and at least two layers of metal interconnects; and a second chip, wherein the second chip includes prefabricated CMOS circuits, a cavity, and a CMUT second electrode, wherein the first chip and the second chip are face to face combined by fusion bonding, wherein the second chip comprises a thinned monocrystalline silicon layer which works as a mechanical layer of CMUT.

Preferably, the SOC ultrasonic transducer further comprises TOVs which penetrate the first chip and the second chip and vertically interconnect the first and the second chips.

Preferably, the second chip comprises metal interconnects located on the mechanical layer for connecting the TOVs.

BRIEF DESCRIPTION OF THE DRAWINGS

The advantages and spirit related to the present invention can be further understood via the following detailed description and drawings.

DETAILED DESCRIPTION OF THE PREFERRED EMBODIMENT

Figure 1:
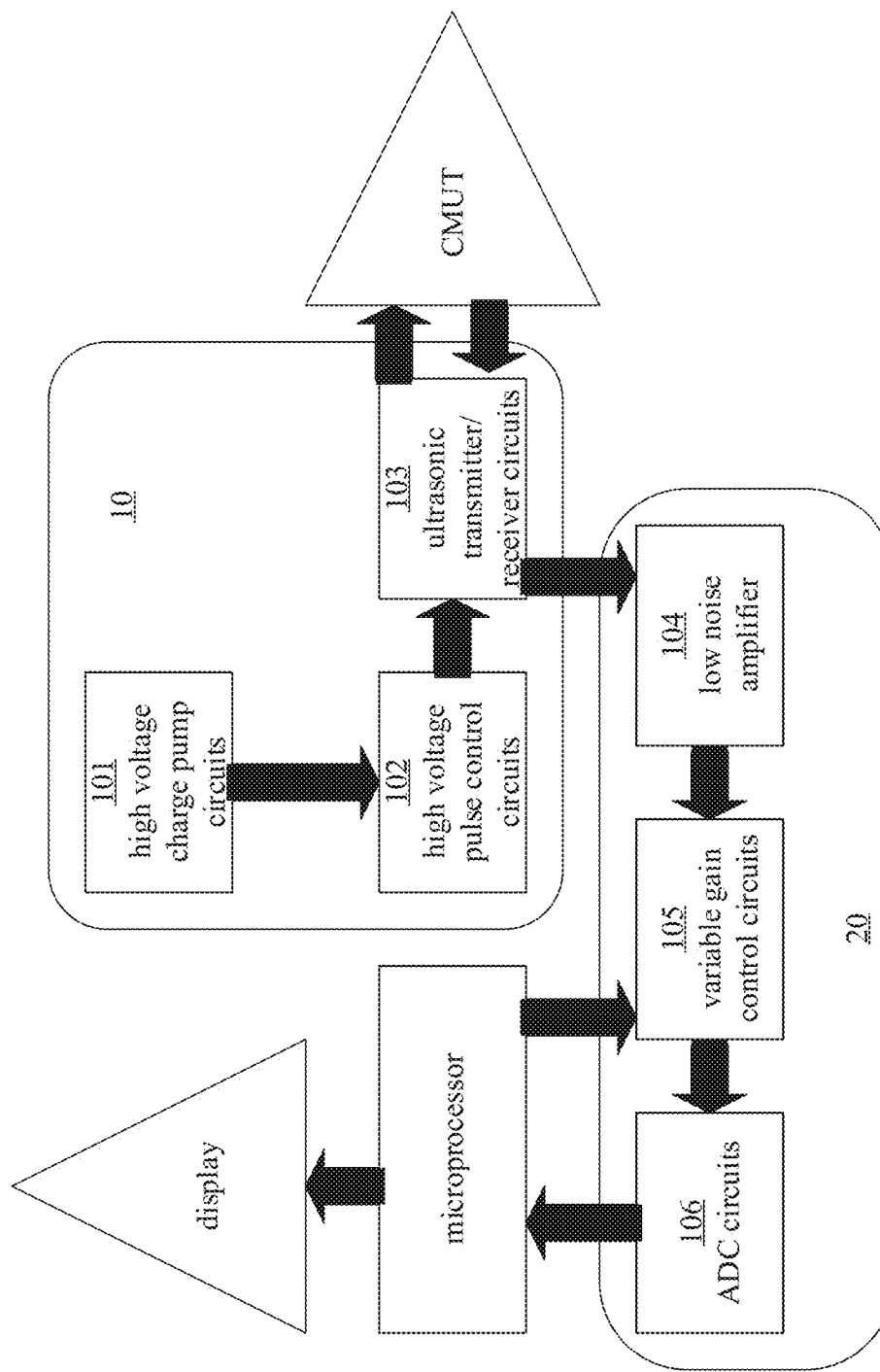
FIG. 1 shows a circuit block diagram of a typical CMUT system.

The present invention will be further described in detail below in conjunction with the accompanying drawings and embodiments. The technical means adopted by the present invention to achieve the predetermined purpose of the invention are further described below with reference to the drawings and preferred embodiments of the present invention. It should be understood that the specific embodiments described herein are only used to explain the present invention, but not to limit the present invention. In addition, it should be noted that, for the convenience of description, the drawings only show some but not all structures related to the present invention. In the various figures, like components are designated by like reference numerals. For the sake of clarity, various parts in the figures have not been drawn to scale. Additionally, some well-known parts may not be shown. For the sake of simplicity, the semiconductor structure obtained after several steps can be depicted in one figure.

Numerous specific details of the present invention are described below, such as device structures, materials, dimensions, processing techniques and techniques, in order to provide a clearer understanding of the present invention. However, as can be understood by one skilled in the art, the present invention may be practiced without these specific details.

It should be noted that the embodiments of the present invention describe the process steps in a specific order, which is only for illustrating the specific embodiment, rather than limiting the sequence of the steps. In different embodiments of the present invention, the sequence of each step can be adjusted according to the adjustment of the process.

The invention may be fulfilled in various implementations. Some of embodiments as described below.

Figure 2:
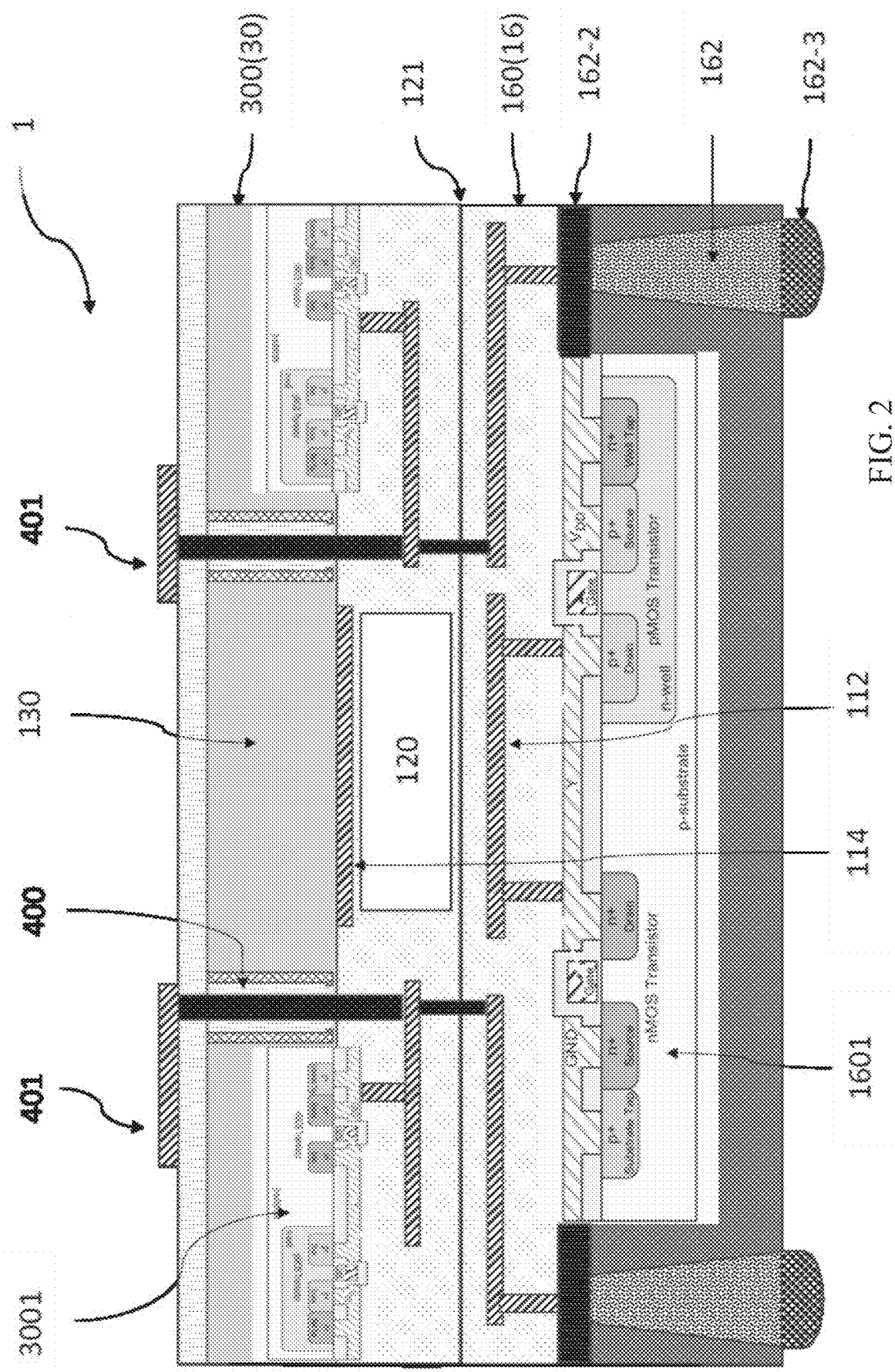
FIG. 2 shows a profile diagram of an ultrasonic transducer in accordance with an embodiment of the present invention.

FIG. 2 shows a profile diagram of an ultrasonic transducer in accordance with an embodiment of the present invention. As shown in FIG. 2, the ultrasonic transducer 1 provided by the present invention comprises a first chip 160 and a second chip 300, which come from a first wafer 16 and a second wafer 30, respectively. The first chip 160 comprises a silicon substrate and substrate material. CMOS circuits 1601 are prefabricated on the substrate. A CMUT first electrode 112 and metal interconnects are prefabricated in the substrate material. CMOS circuits 3001, a cavity 120 and a CMUT second electrode 114 of the second chip 300 are prefabricated.

A bonding oxide interface 121 between the first chip 160 and the second chip 300 is formed by fusion bonding the first wafer 16 and the second wafer 30 face to face. A monocrystalline silicon layer as thin as 1 to 4 micrometers act as a mechanic layer 130 of CMUT by thinning a back side of the second chip 300. The thinning step may be implemented by mechanical grinding, chemical etching, CMP (chemical mechanical polishing) et etc. An oxide via 400 of the ultrasonic transducer 1 penetrating the first chip 160 and the second chip 300 to fulfill electric connection between the CMUT and CMOS. Metal interconnects 401 are placed in the back side of the second chip 300. A TSV (Through Silicon Via) 162 in the first chip 160 of the ultrasonic transducer 1 is vertically coupled with silicon substrate base of the first chip 160 and alumni metal silicon via pad 162-2 and external silicon via soldering ball 163-3 through the silicon substrate of the first chip 160 in order to extend connection between the ultrasonic transducer 1 and PCB at the back 1I side. Metal wire bonding are avoided so that the encapsulation volume can be reduced dramatically. The ultrasonic transducer 1 comprises at least three layers of semiconductor devices. As shown in the figure, from bottom to top, it shows CMOS circuits of the first chip 160 (first layer) and two layers of semiconductor devices of the second chip 300. The second chip 300 comprises at least two silicon layers, i.e., the silicon device layer where the cavity 300 rested (second layer) and the silicon device layer where the mechanical layer 130 and the CMOS circuits 1301 (third layer) located. The CMOS circuits of the silicon device layer near the first chip 160 can include a bottom electrode 112 of the ultrasonic transducer 1. CMOS chip underneath provides HV (high voltage) pulse to control operations of the membrane (e.g., applying voltage to actuate the membrane or to vibrate the membrane.)

The first wafer 16 and the second wafer 30 are designed according to requirements of SOC ultrasonic transducers. It decides which CMOS circuits are made in the first wafer 16 and those are assigned in the second wafer 30. Thus, corresponding CMOS manufacture processes are applied to make the first wafer 16 and the second wafer 30. Take an example, because the transducer pulse modulation module is required to support high voltage pulse control and output in the ultrasonic transducer system, all high voltage circuits related to the transducer pulse modulation module can be prefabricated in the first wafer 16; and other low voltage low noise circuits required by the analog signal processing module are prefabricated in the second wafer 30. In such way, high voltage circuits and low voltage circuits can be made separately, in different wafers. Compare to the approach that both HV and LV (low voltage) devices are made on the same chip, HV/LV signal interferences can be alleviated or even eliminated in this new approach. In consequence, overall performance is improved, and manufacturing process become less complicated and less costly.

Figure 3:
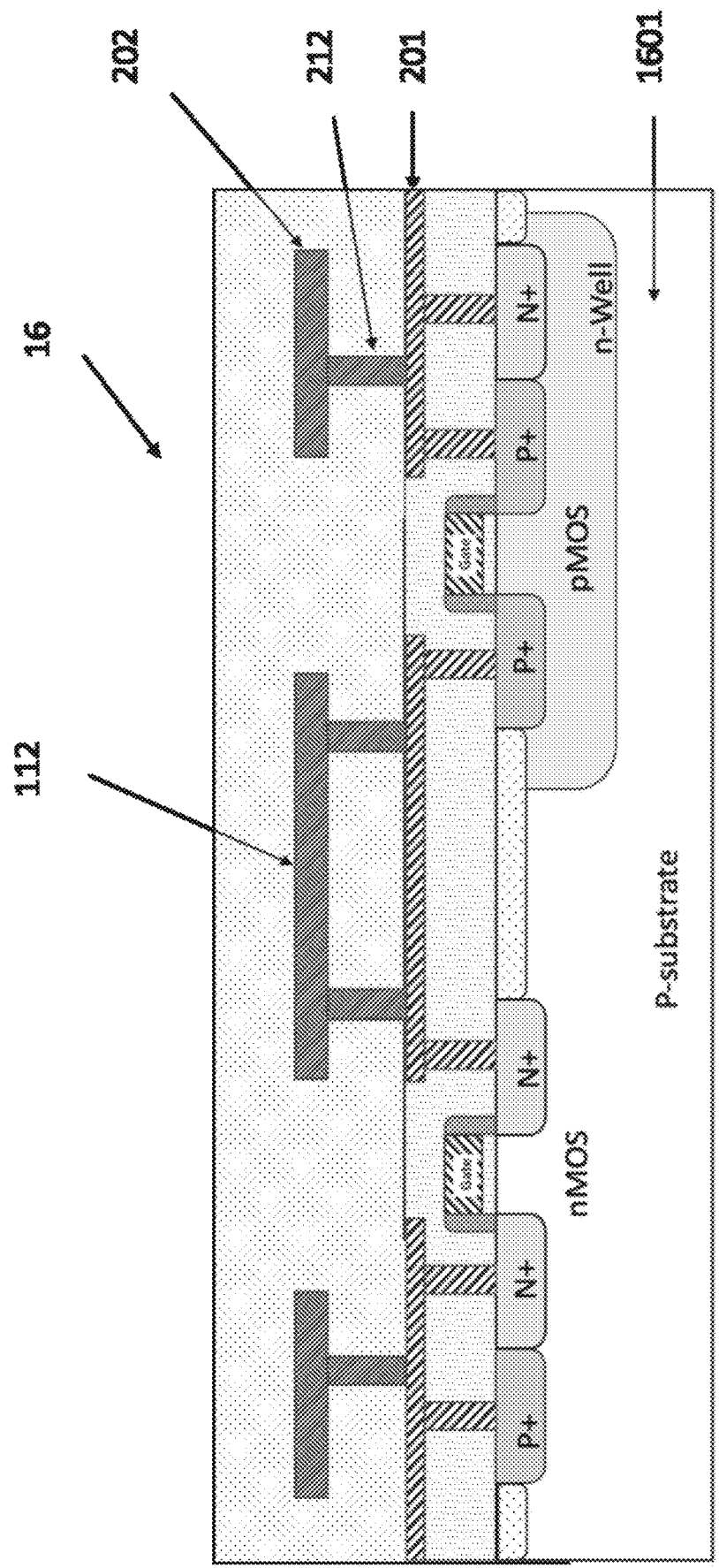
FIG. 3 shows a profile diagram of a first wafer in accordance with an embodiment of the present invention.

FIG. 3 shows a profile diagram of a first wafer in accordance with an embodiment of the present invention. The manufacture processes of the first wafer 16 include but not limit to: manufacturing NMOS and PMOS transistors, isolating structures, making metal interconnects in order to complete the required CMOS circuits. Depending on requirements of SOC integration, the manufacture processes may need to handle multiple layers (6 to 8 layers) of metal interconnects. In order to simply, the figure only depicts two layers of metals, i.e., a first metal layer 201, a second metal layer 202 and a connecting via 212 between the first and the second metal layers. The embodied architecture does not limit the number of metal layers. Particularly, when making the first wafer 16, it needs to consider preservation of the electrical connections between the metal structures and the wafer completed in later processes, which include vertically connected etch-stop layers, TOV (Through Oxide Via) 400, and metal connections between the TOV 400 and the first wafer 16 as well as the second wafer 30. The CMUT first electrode 112 works as a bottom layer metal electrode of CMUT is also made inside the first wafer 16.

Figure 4:
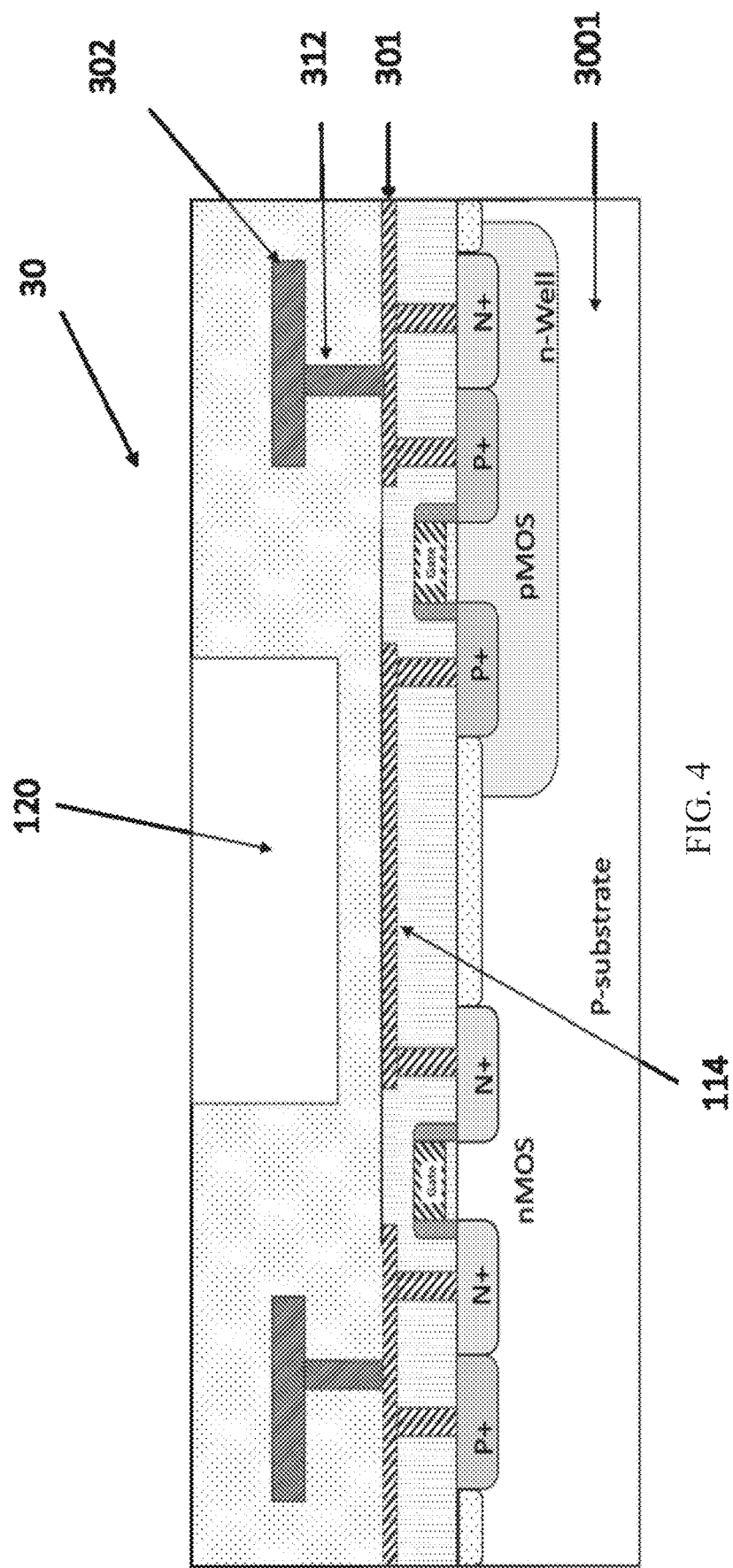
FIG. 4 shows a profile diagram of a second wafer in accordance with an embodiment of the present invention.

FIG. 4 shows a profile diagram of a second wafer in accordance with an embodiment of the present invention. The manufacture processes of the second wafer 30 include but not limit to: manufacturing NMOS and PMOS transistors, isolating high/low voltage devices, making metal interconnects in order to complete the required CMOS circuits. The second wafer 30 needs to include CMOS auxiliary circuits assigned according to the requirements of manufacturing SOC ultrasonic transducer system. More specifically, in case that the first wafer 16 includes low voltage low noise CMOS circuits, the second wafer 30 needs to include high voltage CMOS circuits, which comprise high voltage charge pump circuits, high voltage pulse modulation and control circuits, high voltage switch circuits et etc. Reversely, in case that the first wafer 16 includes high voltage circuits, the second wafer 30 needs to include low voltage low noise CMOS circuits.

In the present embodiment, the second wafer 30 is required to include high voltage circuits. Hence it needs to manufacture high voltage BCD (Bipolar-CMOS-DMOS) device or LDMOS (laterally diffused metal oxide semiconductor) device. High voltage BCD or LDMOS devices include high voltage DMOS (diffused metal oxide semiconductor) transistors. BCD manufacture process is more complicated than standard CMOS manufacture process. Additional photomasks are required to make high voltage oxide layer, drain end design of high voltage transistor, high/low voltage device isolations et etc. The high voltage circuits manufacture process needs additional photomask to fabricate thicker gate oxide and doping drain end of LDMOS. And it further needs high voltage isolation well which is not described in detail herein. When implementing, proper steps can be selected from well-known manufacture technologies according to the requirements. Besides, based on the requirements of SOC integration, the second wafer 30 may need multiple layers of metal interconnects (3 to 6 layers). In order to simplify, the figure only depicts two layers of metals, i.e., a first metal layer 301, a second metal layer 302 and a connecting via 312 between the first and the second metal layers. The embodied architecture does not limit the number of metal layers. Particularly, like making the first wafer 16, when making the second wafer 30, it needs to consider preservation of the electrical connections between the metal structures and the wafer completed in later processes, which include vertically connected etch-stop layers, TOV 400, and metal connections between the TOV 400 and the first wafer 16 as well as the second wafer 30. A critical structure of CMUT, i.e., the cavity, would be formed inside the second wafer 30. The size and depth of the cavity is designed according to the expected operations of the ultrasonic transducer to be made (for example, operating frequencies and voltages) in order to calculate its span and depth D. In some embodiments, the depth D may be around 2 to 10 micrometers. The thickness of the mechanical layer and the CMUT second electrode 114 which works as upper layer metal electrodes of CMUT are required to be tailored specifically. For example, thicker mechanical layer and upper layer metal relatively reduce vibration magnitudes. Thus, output power is decreased.

Figure 5:
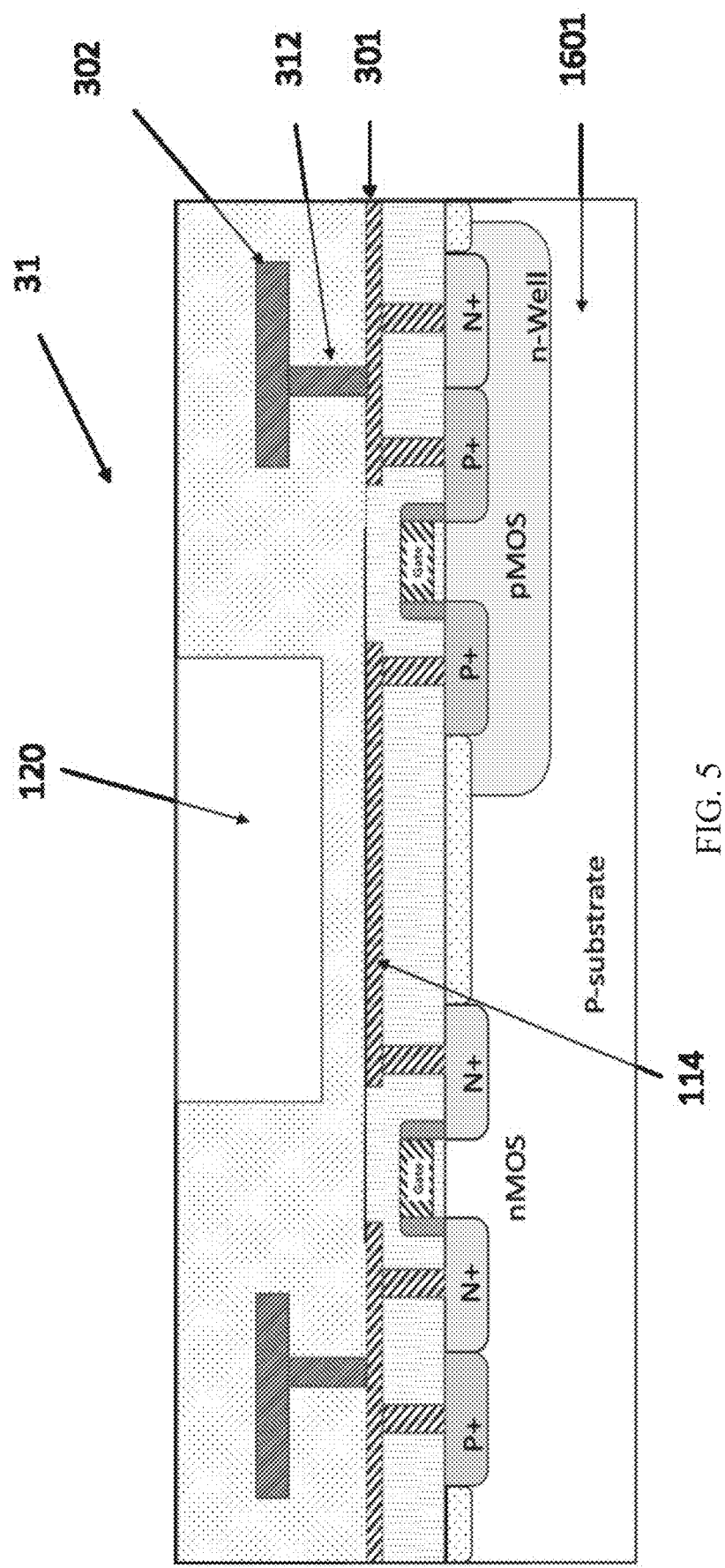
FIG. 5 shows a profile diagram of a second wafer in accordance with another embodiment of the present invention.

FIG. 5 shows a profile diagram of a second wafer in accordance with another embodiment of the present invention. There are multiple layers of metal interconnects within, i.e., a first metal layer 301, a second metal layer 302 and a connecting via 312 between the first and the second metal layers. The embodied architecture does not limit the number of metal layers.

Figure 6:
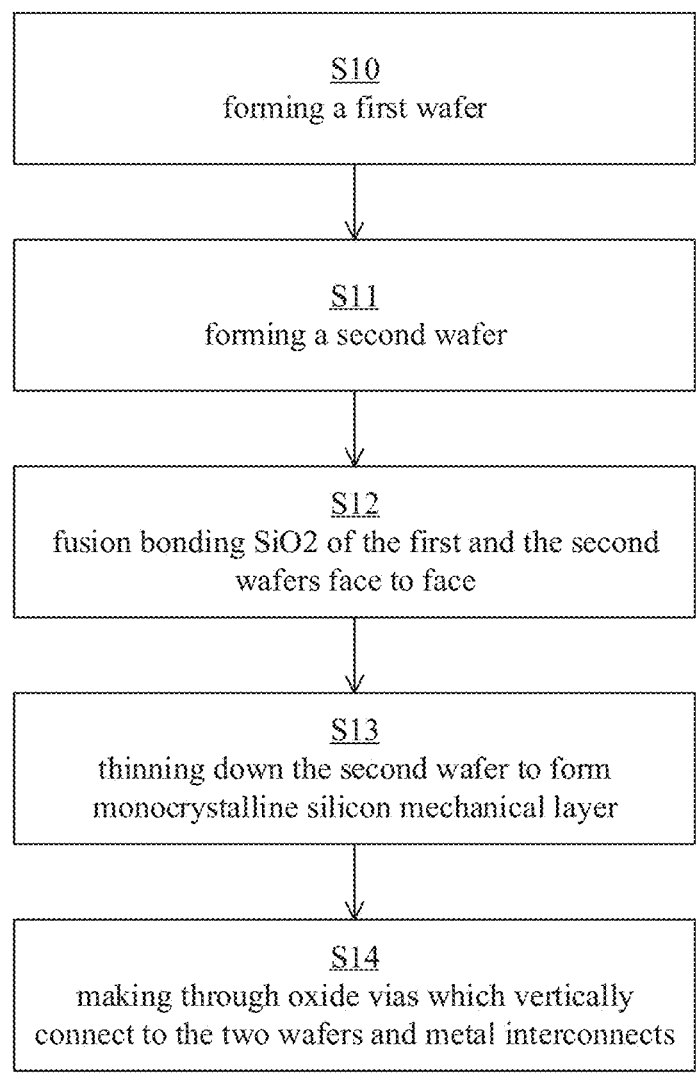
FIG. 6 depicts a flowchart diagram of a manufacturing method of an ultrasonic transducer in accordance with an embodiment of the present invention.

FIG. 6 depicts a flowchart diagram of a manufacturing method of an ultrasonic transducer in accordance with an embodiment of the present invention. Multiple stages are described according to the manufacturing method of the ultrasonic transducer provided by the present invention.

First, according to design requirements of the SOC ultrasonic transducer, assigning CMOS circuits to the first wafer 16 or the second wafer 30. Subsequently, the first wafer 16 and the second wafer 30 are manufactured by CMOS wafer manufacture processes.

Step S10, forming the first wafer. Preparing the first wafer by growing SiO2 with thickness around 100 nano meter as a silicon substrate on a surface. It comprises following steps, S101: (a) preparing initial material, P-type silicon, (b) forming a SiO2 buffer layer, (c) coating photoresist, (d) etching N-well, (e) etching N-well SiO2 layer, (f) diffusing the N-well, (g) ion-implanting the N-well, and (h) removing the SiO2 buffer layer. It further comprises following steps S102: (a) oxidating gates of transistors and deposing polysilicon, (b) lithographing polysilicon gate and etching, (c) coating photoresist, (d) lithographing N+ source/drain ends and N-well tap, (e) ion-implanting source/drain ends, (f) removing photoresist. It further comprises following steps S103: (a) forming P+ source/drain ends and P− substrate tap (by utilizing lithographing, ion-implanting, photoresist removing and annealing processes), (b) forming ILD electric isolations including non-doped SiO2 and BP-doping SiO2 deposition, reflow, lithography and etch of contacts, (c) forming metal interconnect layers, including contact metal sputtering, W CVD and CMP, alumni metal deposition, lithography, etching and photoresist removing processes, and repeat for multiple metal layers.

Step S11, forming the second wafer. Preparing the second wafer by growing SiO2 with thickness around 100 nano meter as a silicon substrate on a surface and fabricating CMOS units on top of p−/p+ expitaxial silicon substrate. The thickness of the p− epitaxial is corresponding to the thickness of mechanical layer of CMUT. As aforementioned, depending on design requirements of SOC ultrasonic transducer and allocation of circuits, NMOS and PMOS transistors are made on the first wafer 16 and the second wafer 30. It further includes isolating structures, making metal interconnects, and constructing required CMOS circuits. Besides, based on the requirements of SOC integration, the second wafer 30 may need multiple layers of metal interconnects (3 to 6 layers). For simplification, FIG. 4 and FIG. 5 only depict two layers of metals, i.e., a first metal layer 301, a second metal layer 302 and a connecting via 312 between the first and the second metal layers. The embodied architecture does not limit the number of metal layers. Particularly, like making the first wafer 16, when making the second wafer 30, it needs to consider preservation of the electrical connections between the metal structures and the wafer completed in later processes, which include vertically connected etch-stop layers, TOV 400, and metal connections between the TOV 400 and the first wafer 16 as well as the second wafer 30. Different from the first wafer 16, the second wafer 30 may further includes high voltage circuits and devices such as high voltage BCD devices and LDMOS devices. BCD manufacture process is more complicated than standard CMOS manufacture process. Additional photomasks are required to make high voltage oxide layer, drain end design of high voltage transistor, high/low voltage device isolations et etc. The high voltage circuits manufacture process needs additional photomask to fabricate thicker gate oxide and doping drain end of LDMOS. Meanwhile it further needs high voltage isolation well. The aforementioned steps are also included in the step of forming the second wafer and can be selected from well-known manufacture technologies according to the requirements. The steps of forming the first wafer and the second wafer can be switched. The present invention does not limit precedence of the steps.

Step S12, fusion bonding SiO2 of the first and the second wafers face to face. At first, plasma treating the surfaces of the wafers. Next, aligning these two wafers face to face, and pressing them for fusion bonding. At last, annealing after they are boned. The bonding is performed by a low temperature process. In principle, the bonding temperature may not be higher than 450 Celsius degrees such that CMOS IC would not be damaged. However, in order to ensure the bonding of two wafers are strong enough, it may use high temperature process. For example, after a low temperature wafer fusion bonding process, a high temperature annealing process may be used.

Step S13, thinning down the second wafer to form a monocrystalline silicon mechanical layer.

The thinning process is performed on the side of the second wafer 30 after the stacked wafers are bonded. The second wafer 30 to be thinned is formed with p−/p+ silicon epitaxial. The thickness of the p− silicon epitaxial is corresponding to the desired thickness of monocrystalline silicon after being thinned. And this layer of monocrystalline silicon is an important structure of the ultrasonic transducer. It is a major component of the mechanical layer.

Figure 7:
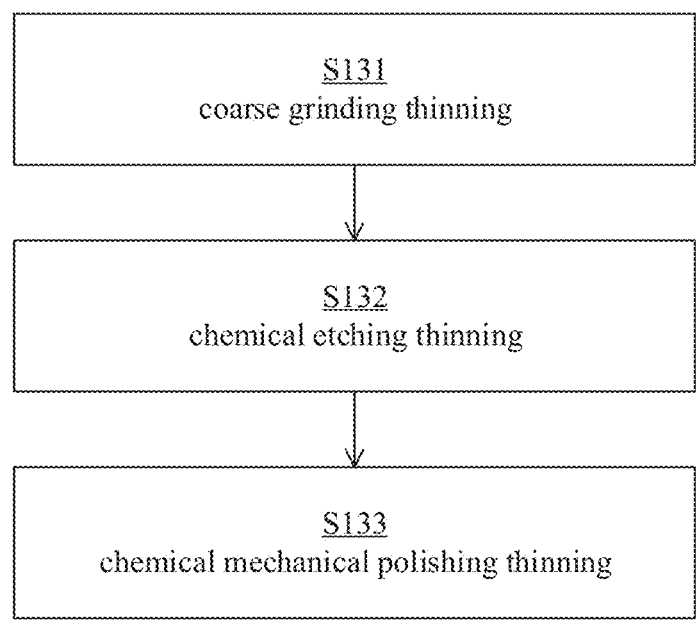
FIG. 7 depicts a thinning step as shown in FIG. 6.

Please refer to FIG. 7, which depicts details of the thinning process. The thinning process comprises the first step S131, coarse grinding thinning, i.e., usually mechanical grinding. After mechanical grinding, the back side of the second wafer may be thinner than 150 micrometers. The second step S132, chemical etching thinning. The chemical etching thinning may be with doping concentration dependent etch rate control. Choosing appropriate chemical reagent wherein its etching rate is strongly corresponding to doping density of silicon layer. The etching rate with regard to p+ material is far higher than p− silicon crystals. Thus, a key target of the thinning can be achieved because the chemical etching can evenly stop at an interface of p−/p+ epitaxial. After the chemical thinning, the silicon material may be as thick as 5 to 10 micrometers and the error of uniformity can be controlled within +/−0.2 micrometers. The uniformity requirement is critically important to high density of ultrasonic array products and to performance parameters of CMOS devices and circuits within the mechanical layer. Thinner silicon layer may reduce breakdown voltage of high voltage circuits. Uniformity and yield rate of later TOV etching would be influenced by uneven thickness of silicon layer. Besides, it may further perform step S133, CMP, to further reduce the thickness of the wafer to 1 to 4 micrometers.

Step S14, making TOVs which vertically connect to the two wafers and metal interconnects.

Please refer to FIG. 2, which depicts a profile diagram of an ultrasonic transducer in accordance with an embodiment of the present invention. After the bonding is completed, TOVs 400 and metal interconnects 401 are made in order to fulfill electric connections between CMUT and CMOS.

At last, by TSV manufacture process to make TSV 162, silicon via soldering ball 162-3, alumni metal silicon via pad 162-2, the connections between the ultrasonic transducer 1 and PCB are extended to the back side. Metal wire bonding are avoided so that the encapsulation volume can be reduced dramatically.

In summary, the present invention is based on fusion bonding of active wafers which have prefabricated CMOS devices. Two wafers with prefabricated CMUT devices and CMOS devices are processed by stacking, thinning, and three-dimensional metal vertical interconnecting processes to fulfill a SOC integration of high-density ultrasonic transducers and multiple layers of CMOS circuits. The adopted active wafer bonding and thinning technologies and vertical interconnecting between wafers can be realized in both 8 inch and 12-inch wafer manufacture fabs. The manufacture processes published by the present invention provide innovations of process flow. Utilizing more mature and larger scale processes replaces expensive SOI material to realize CMUT-on-CMOS with monocrystalline silicon vibration mechanical layer. The provided manufacture processes are more economic with higher degree des, because the auxiliary circuits of ultrasonic transducers can be prefabricated in wafers as SOC integration, a stack of ultrasonic transducer and multiple layers of the auxiliary circuits is formed after being bonded. This stack provides more economical utilization of spatial volume and high-density SOC system architecture is achieved in consequently. Due to highly integration of the SOC system architecture provided by the present invention, three layers of semiconductor devices can be made. Part of the CMOS circuits can be integrated in the CMUT mechanical layer. The provided SOC system architecture is full functioned. Thus, installing multiple chips to a PCB for forming a CMUT system and designing the auxiliary circuits such as transducer pulse modulation module and analog signal processing module for interconnection are avoided. It can further reduce number of IC on the PCB and decrease the complexity of circuits.

Moreover, based on CMUT SOC system architectures provided by the present invention, more auxiliary circuits of CMUT system, e.g., ADC circuits, can be implanted into CMUT array chip to realize digital signal outputs of the ultrasonic transducers. Furthermore, based on CMUT SOC system architectures provided by the present invention, low noise amplifier can be implanted into CMUT array chip for dramatically reducing high spurious noise and low signal-noise-ratio problems caused by wiring and soldering for interconnecting the chip and the PCB.

The above descriptions are only preferred embodiments of the present invention, and do not limit the present invention in any form. Although the present invention has been disclosed above with preferred embodiments, it is not intended to limit the present invention. Within the scope of not departing from the technical solution of the present invention, when the technical content disclosed above can be used to make some changes or modifications to equivalent embodiments with equivalent changes, but any content that does not depart from the technical solution of the present invention, according to the present invention Any simple modifications, equivalent changes and modifications made to the above embodiments still fall within the scope of the technical solutions of the present invention.

What is claimed is:

1. A SOC (system-on-chip) ultrasonic transducer, comprising:
   a first chip, wherein the first chip comprises a silicon substrate and substrate material, wherein the silicon substrate includes prefabricated CMOS circuits and wherein the substrate material includes prefabricated a CMUT first electrode and at least two layers of metal interconnects; and a second chip, wherein the second chip includes prefabricated CMOS circuits, a cavity, and a CMUT second electrode, wherein the first chip or the second chip does not include SOI material, wherein the first chip and the second chip are face to face combined by fusion bonding, wherein the second chip comprises a thinned monocrystalline silicon layer which works as a mechanical layer of CMUT, and wherein the thinning comprises chemical etching the second wafer on the back side with a thinning uniformity requirement of +/−0.2 micrometers;

the cavity and the CMUT second electrode have predetermined size parameters;

the second chip comprises drain end of high voltage transistor or high/low voltage device isolation.

2. The SOC ultrasonic transducer as claimed in claim 1, wherein the SOC ultrasonic transducer comprises three layers of semiconductor devices, wherein the second chip is thinned at its back side, wherein the second chip comprises CMOS circuits located in the same layer of the mechanical layer of CMUT.

3. The SOC ultrasonic transducer as claimed in claim 1, wherein the second chip comprises prefabricated high voltage charge pump circuits.

4. The SOC ultrasonic transducer as claimed in claim 1, further comprises prefabricated high voltage BCD (bipolar-CMOS-DMOS) device or LDMOS (laterally diffused drain metal oxide semiconductor) device.

5. The SOC ultrasonic transducer as claimed in claim 1, further comprises TOVs which penetrate the first chip and the second chip and vertically interconnect the first and the second chips.

6. The SOC ultrasonic transducer as claimed in claim 5, wherein the second chip comprises metal interconnects located on the mechanical layer for connecting the TOVs.

7. The SOC ultrasonic transducer as claimed in claim 1, wherein the first chip comprises TSVs (Through Silicon Vias) which penetrate the silicon substrate for connecting alumni metal silicon via pads and external silicon via soldering balls with the silicon substrate vertically.

8. The SOC ultrasonic transducer as claimed in claim 1, wherein a back side of the second chip is reduced to be less than 150 micrometers thick by mechanically grinding thinning.

9. The SOC ultrasonic transducer as claimed in claim 1, wherein a back side of the second chip is reduced to around 5 to 10 micrometers thick by chemical etching thinning.

10. The SOC ultrasonic transducer as claimed in claim 1, wherein a back side of the second chip is reduced to around 1 to 4 micrometers thick by chemical mechanical polishing thinning.

* * * * *